US012703819B2

(12) United States Patent
Hoshiyama et al.

(10) Patent No.: US 12,703,819 B2
(45) Date of Patent: Aug. 11, 2026

(54) THERMALLY CONDUCTIVE RESIN SHEET

(71) Applicant: SEKISUI CHEMICAL CO., LTD., Osaka (JP)

(72) Inventors: Yuuki Hoshiyama, Hasuda (JP); Kento Tsuchiya, Hasuda (JP); Nobuhiko Inui, Hasuda (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 265 days.

(21) Appl. No.: 18/280,824

(22) PCT Filed: Mar. 10, 2021

(86) PCT No.: PCT/JP2021/009632
§ 371 (c)(1),
(2) Date: Sep. 7, 2023

(87) PCT Pub. No.: WO2022/190293
PCT Pub. Date: Sep. 15, 2022

(65) Prior Publication Data

US 2024/0141222 A1 May 2, 2024

(51) Int. Cl.
*C09K 5/14* (2006.01)
*C08K 7/18* (2006.01)
*H10W 40/25* (2026.01)

(52) U.S. Cl.
CPC .................. *C09K 5/14* (2013.01); *C08K 7/18* (2013.01); *H10W 40/257* (2026.01); (Continued)

(58) Field of Classification Search
CPC ...... C09K 5/14; C08K 7/18; C08K 2201/001; C08K 2201/005; C08K 2201/014; C08K 2201/016; H01L 23/3733
See application file for complete search history.

(56) References Cited

U.S. PATENT DOCUMENTS 7,018,701 B2 3/2006 Yamada et al.
2009/0152491 A1* 6/2009 Saga ........................ C08K 9/04 252/79
(Continued)

FOREIGN PATENT DOCUMENTS

CN 103242510 8/2013
JP 2004-204154 7/2004
(Continued)

OTHER PUBLICATIONS

International Search Report (ISR) issued Jun. 8, 2021 in International (PCT) Application No. PCT/JP2021/009632.
(Continued)

*Primary Examiner* — Travis M Figg
(74) *Attorney, Agent, or Firm* — Wenderoth, Lind & Ponack, L.L.P.

(57) ABSTRACT

The heat-conducting resin sheet according to an aspect of the present invention comprises a thermally conductive plate-shaped particle, a thermally conductive spherical particle, and a resin, wherein the heat-conducting resin sheet has a thermal conductivity of 5 W/m·K or more and a 30% compressive strength B of 1500 kPa or less as measured at a compression rate of 1.0 mm/min. Furthermore, a volume ratio of the thermally conductive plate-shaped particle to the thermally conductive spherical particle (volume of thermally conductive plate-shaped particle/volume of thermally conductive spherical particle) is 30/70 to 90/10, and the total volume of the thermally conductive plate-shaped particle and the thermally conductive spherical particle is 30 to 90% by volume. According to the present invention, there can be provided a heat-conducting resin sheet that is excellent in the thermal conductivity and flexibility and can suppress the increase in the stress even when compressed quickly.

9 Claims, 1 Drawing Sheet

(52) U.S. Cl.
CPC .. *C08K 2201/001* (2013.01); *C08K 2201/005* (2013.01); *C08K 2201/014* (2013.01); *C08K 2201/016* (2013.01)

(56) References Cited

U.S. PATENT DOCUMENTS

| | | | | |
|---|---|---|---|---|
| 2019/0176448 | A1 | 6/2019 | Mukohata et al. | |
| 2019/0241786 | A1 | 8/2019 | Hamada et al. | |
| 2020/0227337 | A1 | 7/2020 | Hamada | |
| 2022/0073805 | A1* | 3/2022 | Hoshiyama | C09K 5/14 |
| 2022/0112419 | A1* | 4/2022 | Yamada | C09K 5/14 |

FOREIGN PATENT DOCUMENTS

| | | | |
|---|---|---|---|
| JP | 2010-077220 | 4/2010 | |
| JP | 2010-132866 | 6/2010 | |
| JP | 2011503328 A * | 1/2011 | C08K 9/04 |
| JP | 2011-162642 | 8/2011 | |
| JP | 2012-38763 | 2/2012 | |
| JP | 2013-103375 | 5/2013 | |
| JP | 2013-254880 | 12/2013 | |
| JP | 2015-174906 | 10/2015 | |
| JP | 2018-203857 | 12/2018 | |
| JP | 2019-24045 | 2/2019 | |
| JP | 2020-196892 | 12/2020 | |
| WO | 2018/030430 | 2/2018 | |
| WO | 2018/101445 | 6/2018 | |
| WO | 2019/022070 | 1/2019 | |
| WO | 2020/153377 | 7/2020 | |
| WO | WO-2020153377 A1 * | 7/2020 | H10W 40/251 |

OTHER PUBLICATIONS

International Search Report issued Apr. 14, 2020 in International (PCT) Application No. PCT/JP2020/001992.

* cited by examiner

THERMALLY CONDUCTIVE RESIN SHEET

TECHNICAL FIELD

The present invention relates to a heat-conducting resin sheet.

BACKGROUND ART

The heat-conducting resin sheet is mainly disposed between a heating element, such as a semiconductor package, and a heat sink, such as aluminum or copper, to function for quickly transferring the heat generated in the heating element to the heat sink. Recently, with the high integration in semiconductor devices and the high density of wiring in semiconductor packages, the amount of heat generation per unit area of a semiconductor package has become large, and accordingly, a heat-conducting resin sheet has grown in demand that has an improved thermal conductivity as compared with conventional heat-conducting resin sheets and thus accelerates more quick heat dissipation.

As such a heat-conducting resin sheet, a heat-conducting resin sheet including a thermally conductive filler is known. For example, PTL 1 discloses an invention relating to a heat-conducting resin sheet including a liquid polybutene and a thermally conductive filler, and PTL 2 discloses an invention relating to a heat-conducting resin sheet including an epoxy resin, and hexagonal boron nitride or the like as a thermally conductive filler.

PTL 3 discloses a resin composition including a specific thermally conductive plate-shaped particle and a specific thermally conductive spherical particle in combination, and also discloses that the resin composition is excellent in thermal conductivity.

CITATION LIST

Patent Literature

PTL 1: JP 2012-38763A
PTL 2: JP 2013-254880A
PTL 3: JP 2015-174906A

SUMMARY OF INVENTION

Technical Problem

Generally, when the content of a thermally conductive filler in a heat-conducting resin sheet is increased to improve the thermal conductivity, the sheet is hard. This raises a concern that a solder crack or a warp of the substrate may be caused inside an electronic device including the sheet to exert a damage to electronic components. In other words, it is difficult to increase the thermal conductivity of a heat-conducting resin sheet and simultaneously maintain favorable flexibility thereof, and there is a need for technique for achieving both.

Recently, the assembling process has been automated because of, for example, the complication of electronic modules and the increase in the number of parts thereof, and a heat-conducting resin sheet is quickly compressed and installed inside an electronic device. When the heat-conducting resin sheet is quickly compressed, a stress tends to be applied to the substrate and electronic components inside the electronic device, which may cause a warp of the substrate, for example. Also, when the heat-conducting resin sheet is intended to be quickly compressed, it may be difficult to compress it to a desirable compression ratio because of the increase in the stress, and therefore difficult to install it inside the electronic device.

The present invention has been made in light of the conventional problems as described above, and an object of the present invention is to provide a heat-conducting resin sheet that is excellent in the thermal conductivity and flexibility and can suppress the increase in the stress even when compressed quickly.

Solution to Problem

The inventors have studied diligently to achieve the object described above. As a result, they have found that the above-described problems can be solved by a heat-conducting resin sheet including a thermally conductive plate-shaped particle, a thermally conductive spherical particle, and a resin, the heat-conducting resin sheet having a thermal conductivity, a 30% compressive strength, a volume ratio of the thermally conductive plate-shaped particle to the thermally conductive spherical particle, and a total volume of the thermally conductive plate-shaped particle and the thermally conductive spherical particle, all within respective specific ranges, and thus have completed the present invention.

Furthermore, the inventors have also found that the above-described problems can also be solved by another heat-conducting resin sheet including a thermally conductive plate-shaped particle, a thermally conductive spherical particle, and a resin, the heat-conducting resin sheet having a thermal conductivity, a 30% compressive strength as measured at a compression rate of 1.0 mm/min, and a ratio between specific compressive strengths as measured at different compression rates, all within respective specific ranges, and thus have completed the present invention.

Specifically, the present invention relates to [1] to [9] below.

[1] A heat-conducting resin sheet comprising a thermally conductive plate-shaped particle, a thermally conductive spherical particle, and a resin,

- the heat-conducting resin sheet having a thermal conductivity of 5 W/m·K or more and a 30% compressive strength B of 1500 kPa or less as measured at a compression rate of 1.0 mm/min,
- a volume ratio of the thermally conductive plate-shaped particle to the thermally conductive spherical particle (volume of thermally conductive plate-shaped particle/volume of thermally conductive spherical particle) of 30/70 to 90/10, and
- the total volume of the thermally conductive plate-shaped particle and the thermally conductive spherical particle of 30 to 90% by volume.

[2] A heat-conducting resin sheet comprising a thermally conductive plate-shaped particle, a thermally conductive spherical particle, and a resin,

- the heat-conducting resin sheet having a thermal conductivity of 5 W/m·K or more and a 30% compressive strength B of 1500 kPa or less as measured at a compression rate of 1.0 mm/min, and
- compressive strength B/compressive strength A of 2 or less, or compressive strength C/compressive strength B of 2 or less, where compressive strength A is a 30% compressive strength as measured at a compression rate of 0.1 mm/min and compressive strength C is a 30% compressive strength as measured at a compression rate of 10.0 mm/min.

[3] The heat-conducting resin sheet according to the above [1] or [2], wherein the thermally conductive plate-shaped particle has an average particle size of 1 to 400 μm, and the thermally conductive spherical particle has an average particle size of 1 to 100 μm.

[4] The heat-conducting resin sheet according to any of the above [1] to [3], wherein the heat-conducting resin sheet has a heat resistance of 5 K/W or less under 10% compression.

[5] The heat-conducting resin sheet according to any of the above [1] to [4], wherein an average filler aspect ratio is 5 or more.

[6] The heat-conducting resin sheet according to any of the above [1] to [5], wherein a major axis of the thermally conductive plate-shaped particle is oriented at an angle of 60° or more with respect to a surface of the sheet.

[7] The heat-conducting resin sheet according to any of the above [1] to [6], wherein the resin is an elastomer resin.

[8] The heat-conducting resin sheet according to the above [7], wherein the elastomer resin comprises a liquid elastomer resin.

[9] The heat-conducting resin sheet according to any of the above [1] to [8], wherein the heat-conducting resin sheet is crosslinked.

Advantageous Effects of Invention

According to the present invention, there can be provided a heat-conducting resin sheet that is excellent in the thermal conductivity and flexibility and can suppress the increase in the stress even when compressed quickly.

DESCRIPTION OF EMBODIMENTS

[Heat-Conducting Resin Sheet]

Figure 1:
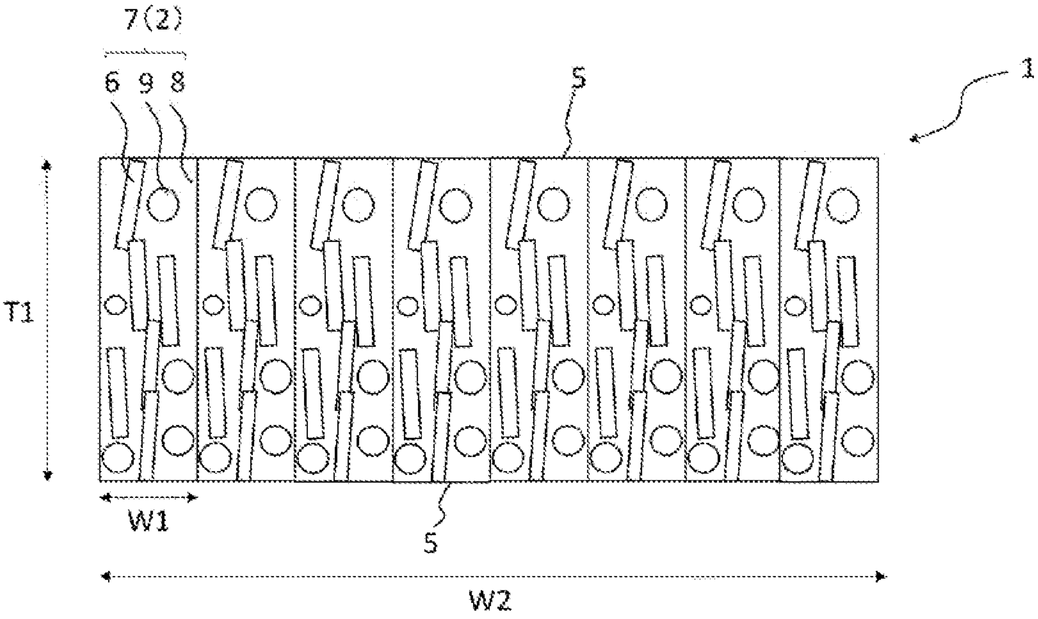
FIG. 1 is an illustrative cross-sectional view of a heat-conducting resin sheet consisting of a laminated body.

The heat-conducting resin sheet according to an aspect of the present invention is a heat-conducting resin sheet comprising a thermally conductive plate-shaped particle, a thermally conductive spherical particle, and a resin, and the heat-conducting resin sheet has a thermal conductivity of 5 W/m·K or more and a 30% compressive strength B of 1500 kPa or less as measured at a compression rate of 1.0 mm/min. Additionally, the heat-conducting resin sheet according to the aspect of the present invention has a volume ratio of the thermally conductive plate-shaped particle to the thermally conductive spherical particle (volume of thermally conductive plate-shaped particle/volume of thermally conductive spherical particle) of 30/70 to 90/10, and a total volume of the thermally conductive plate-shaped particle and the thermally conductive spherical particle of 30 to 90% by volume.

The heat-conducting resin sheet according to another aspect of the present invention is a heat-conducting resin sheet comprising a thermally conductive plate-shaped particle, a thermally conductive spherical particle, and a resin, and the heat-conducting resin sheet has a thermal conductivity of 5 W/m·K or more and a 30% compressive strength B of 1500 kPa or less as measured at a compression rate of 1.0 mm/min. Additionally, the heat-conducting resin sheet according to another aspect of the present invention has compressive strength B/compressive strength A of 2 or less, or compressive strength C/compressive strength B of 2 or less, where compressive strength A is a 30% compressive strength as measured at a compression rate of 0.1 mm/min and compressive strength C is a 30% compressive strength as measured at a compression rate of 10.0 mm/min.

Generally, there is a tendency that a heat-conducting resin sheet has a reduced flexibility as the thermal conductivity thereof is increased. On the other hand, the heat-conducting resin sheet of the present invention has a 30% compressive strength at a certain level or less and therefore excellent flexibility, though it also has a large thermal conductivity. In addition, the heat-conducting resin sheet of the present invention can suppress the increase in the stress even when compressed quickly. Accordingly, it is easy to install it inside an electronic device, and a warp of the substrate or the like inside the electronic device can be suppressed.

<Thermal Conductivity>

The heat-conducting resin sheet of the present invention has a thermal conductivity of 5 W/m·K or more. If the thermal conductivity is less than 5 W/m·K, heat generated by a heating element cannot be dissipated sufficiently. In view of improving the heat-dissipating property of the heat-conducting resin sheet, the thermal conductivity of the heat-conducting resin sheet is preferably 8 W/m·K or more, and more preferably 10 W/m·K or more. A larger thermal conductivity of the heat-conducting resin sheet is more preferable; however, the thermal conductivity thereof is generally 100 W/m·K or less. The thermal conductivity is easily adjusted to a desirable value by regulating, for example, the content of the thermally conductive spherical particle and the content and the orientation of the thermally conductive plate-shaped particle, which will be described later.

<30% Compressive Strength>

The heat-conducting resin sheet of the present invention has a 30% compressive strength B of 1500 kPa or less as measured at a compression rate of 1.0 mm/min. If 30% compressive strength B is more than 1500 kPa, the sheet has poor flexibility and is thus likely to exert a damage to electronic components or others inside an electronic device in which the sheet is used. In view of enhancing the flexibility of the heat-conducting resin sheet, 30% compressive strength B of the heat-conducting resin sheet is preferably 1000 kPa or less, and more preferably 800 kPa or less. 30% compressive strength B of the heat-conducting resin sheet is generally 50 kPa or more, and preferably 200 kPa or more. 30% compressive strength refers to the load when a sheet is compressed by a thickness corresponding to 30% of its original thickness. 30% compressive strength of the heat-conducting resin sheet can be regulated by, for example, the type and crosslink of the resin for forming the heat-conducting resin sheet, and the amounts of the thermally conductive spherical particle and the thermally conductive plate-shaped particle, which will be described later.

The 30% compressive strength B is 30% compressive strength as measured under the conditions of a compression rate of 1.0 mm/min, a size of the test piece of 15 mm×15 mm square, and a thickness of the test piece of 2.0 mm, and specifically, it can be measured by the method described in Examples.

<Thermally Conductive Particle>

The heat-conducting resin sheet of the present invention includes a thermally conductive plate-shaped particle and a thermally conductive spherical particle, and these thermally conductive particles are dispersed in a resin. The thermal conductivity of each thermally conductive particle is not particularly limited, and is preferably 12 W/m·K or more, more preferably 15 to 300 W/m·K, and even more preferably 25 to 300 W/m·K. Since the heat-conducting resin sheet includes these thermally conductive particles, the sheet has a large thermal conductivity. Particularly, the thermally conductive plate-shaped particle oriented in the thickness direction of the heat-conducting resin sheet, as described later, can effectively increase the thermal conductivity. Generally, in a case where the thermal conductivity of a heat-conducting resin sheet is increased by using a thermally conductive plate-shaped particle, the stress when compressed quickly tends to increase; however, when compressed quickly, the heat-conducting resin sheet of the present invention suppress the increase in the stress, though a thermally conductive plate-shaped particle is used therein.

In the heat-conducting resin sheet, the volume ratio of the thermally conductive plate-shaped particle to the thermally conductive spherical particle (thermally conductive plate-shaped particle/thermally conductive spherical particle) is 30/70 to 90/10. If the volume ratio is less than 30/70, the heat-conducting resin sheet has poor thermal conductivity, or has poor flexibility though the thermal conductivity is increased.

If the volume ratio is more than 90/10, the degree of the increase in the stress is large when the heat-conducting resin sheet is compressed quickly. The reason for this is probably that the repulsive force when the heat-conducting resin sheet is compressed quickly is large if the content of the thermally conductive plate-shaped particle is large.

In the heat-conducting resin sheet, the volume ratio of the thermally conductive plate-shaped particle to the thermally conductive spherical particle (volume of thermally conductive plate-shaped particle/volume of thermally conductive spherical particle) is preferably 30/60 to 80/20, and more preferably 40/60 to 80/20, in view of more efficient suppression of the increase in the stress when heat-conducting resin sheet is compressed quickly as well as favorable thermal conductivity and flexibility.

The volume ratio means the volume of the thermally conductive plate-shaped particle relative to the volume of the thermally conductive spherical particle in the heat-conducting resin sheet. The volume of the thermally conductive spherical particle in the heat-conducting resin sheet can be calculated from the mass of the thermally conductive spherical particle and the mass of the thermally conductive spherical particle per unit volume. Similarly, the volume of the thermally conductive plate-shaped particle in the heat-conducting resin sheet can be calculated from the mass of the thermally conductive plate-shaped particle and the mass of the thermally conductive plate-shaped particle per unit volume.

In the heat-conducting resin sheet, the total volume of the thermally conductive plate-shaped particle and the thermally conductive spherical particle is 30 to 90% by volume. If the total volume of the thermally conductive plate-shaped particle and the thermally conductive spherical particle is less than 30% by volume, the heat-conducting resin sheet has a small thermal conductivity, and therefore a poor heat-dissipating property. On the other hand, if the total volume of the thermally conductive plate-shaped particle and the thermally conductive spherical particle is more than 90% by volume, the heat-conducting resin sheet has poor flexibility. The total volume of the thermally conductive plate-shaped particle and the thermally conductive spherical particle is preferably 40 to 80% by volume, more preferably 50 to 70% by volume, and even more preferably 50 to 58% by volume, in view of good balance between the thermal conductivity and the flexibility of the heat-conducting resin sheet.

In the heat-conducting resin sheet, the volume of the thermally conductive plate-shaped particle is preferably 5 to 80% by volume, more preferably 10 to 60% by volume, and even more preferably 15 to 50% by volume. In the heat-conducting resin sheet, the volume of the thermally conductive spherical particle is preferably 3 to 50% by volume, more preferably 5 to 45% by volume, and even more preferably 5 to 40% by volume.

The thermally conductive plate-shaped particle in the present invention is a particle that has a flake or scale shape. Also, the major axis of the particle is sufficiently larger than the thickness, and for example, the aspect ratio thereof is 2 or more, and preferably 3 or more. Here the aspect ratio of the thermally conductive plate-shaped particle means the ratio of the longest length of the particle to the thickness of the particle, longest length/thickness.

The average particle size of the thermally conductive plate-shaped particle is not particularly limited, and is preferably 1 to 400 μm, and more preferably 5 to 300 μm. When the average particle size of the thermally conductive plate-shaped particle is within the above-described range, the ratios between compressive strengths as measured at different compression rates, which will be described later, are easily adjusted to the desired values, and the increase in the stress upon quick compression of the resin sheet can be thus suppressed. The average particle size of the thermally conductive plate-shaped particle can be determined by laser diffraction particle size distribution analysis, and represents the volume-weighted 50th percentile particle size.

The particle shape of the thermally conductive spherical particle in the present invention is a sphere or close to a sphere, and the thermally conductive spherical particle has an aspect ratio of 1, or close to 1, and for example, 1.0 or more and less than 2.0, and preferably 1.0 or more and 1.5 or less. Here, the aspect ratio of the thermally conductive spherical particle means the ratio of the major axis to the minor axis, major axis/minor axis.

The aspect ratio herein is preferably an average value of those of a sufficient number (e.g., 250) of the thermally conductive particles determined through observation under a scanning electron microscope.

The average particle size of the thermally conductive spherical particle is not particularly limited, and is preferably 1 to 100 μm, and more preferably 1 to 80 μm. When the average particle size of the thermally conductive spherical particle is within the above-described range, the compressive strength ratios described later are easily adjusted to the desired values, and the increase in the stress upon quick compression of the resin sheet can be thus suppressed. The average particle size of the thermally conductive spherical particle can be determined by laser diffraction particle size distribution analysis, and represents the volume-weighted 50th percentile particle size.

In the heat-conducting resin sheet of the present invention, the average filler aspect ratio is preferably 5 or more. The average filler aspect ratio is more preferably 10 or more, and even more preferably 20 or more, and also preferably 100 or less. When the average filler aspect ratio is not less than any of these lower limits as described above, the heat-conducting resin sheet tends to have a large thermal conductivity. When the average filler aspect ratio is not more than the upper limit as described above, the increase in the stress upon quick compression of the heat-conducting resin sheet tends to be suppressed.

The average filler aspect ratio means the average of the aspect ratios of the thermally conductive particles included in the heat-conducting resin sheet. Specifically, the average filler aspect ratio can be determined by averaging, in terms of volume, the aspect ratio of the thermally conductive plate-shaped particle and the aspect ratio of the thermally conductive spherical particle. The aspect ratio of the thermally conductive spherical particle is regarded as 1.5 for the calculation.

Specifically, the average filler aspect ratio can be determined by the following formula (1):

Aspect ratio of thermally conductive plate-shaped particle×volume percentage of thermally conductive plate-shaped particle/100+aspect ratio of thermally conductive spherical particle×volume percentage of thermally conductive spherical particle/100 (1)

wherein the volume percentage of the thermally conductive plate-shaped particle means the percentage (%) of the volume of the thermally conductive plate-shaped particle in the whole volume of the thermally conductive particles in the heat-conducting resin sheet, and the volume percentage of the thermally conductive spherical particle means the percentage (%) of the volume of the thermally conductive spherical particle in the whole of the thermally conductive particles in the heat-conducting resin sheet.

Examples of the material for each of the thermally conductive plate-shaped particle and the thermally conductive spherical particle in the present invention include carbides, nitrides, oxides, hydroxides, metals, and carbon materials.

Examples of the carbide include silicon carbide, boron carbide, aluminum carbide, titanium carbide, and tungsten carbide.

Examples of the nitride include silicon nitride, boron nitride, boron nitride nanotubes, aluminum nitride, gallium nitride, chromium nitride, tungsten nitride, magnesium nitride, molybdenum nitride, and lithium nitride.

Examples of the oxide include iron oxide, silicon oxide (silica), aluminum oxide (alumina) (including hydrates of aluminum oxide (boehmite, etc.)), magnesium oxide, titanium oxide, cerium oxide, and zirconium oxide. In addition, other examples of the oxide include transition metal oxides such as barium titanate, and also an oxide doped with a metal ion such as indium tin oxide and antimony tin oxide.

Examples of the hydroxide include aluminum hydroxide, calcium hydroxide, and magnesium hydroxide.

Examples of the metal include copper, gold, nickel, tin, iron, and an alloy thereof.

Examples of the carbon material include carbon black, graphite, diamond, graphene, fullerene, carbon nanotube, carbon nanofiber, nanohorn, carbon microcoil, and nanocoil.

Among the above, boron nitride is preferred for the thermally conductive plate-shaped particle. For the thermally conductive spherical particle, at least one selected from aluminum oxide (alumina), magnesium oxide, aluminum nitride, and aluminum hydroxide is preferred.

For each of the thermally conductive plate-shaped particle and the thermally conductive spherical particle, a plurality of particles made of different materials may be used in combination.

<Resin>

The heat-conducting resin sheet of the present invention includes a resin. The kind of the resin is not particularly limited, and examples include an elastomer resin, an acrylic resin, and a silicone resin. Among these, an elastomer resin is preferable in view of favorable flexibility.

The kind of the elastomer resin is not particularly limited, and examples include acrylonitrile-butadiene rubber, ethylene-propylene-diene rubber, ethylene-propylene rubber, natural rubber, polyisoprene rubber, polybutadiene rubber, hydrogenated polybutadiene rubber, styrene-butadiene block copolymer, hydrogenated styrene-butadiene block copolymer, hydrogenated styrene-butadiene-styrene block copolymer, hydrogenated styrene-isoprene block copolymer, and hydrogenated styrene-isoprene-styrene block copolymers.

The above-described elastomer resin may be a solid elastomer or liquid elastomer at normal temperature (23° C.) and normal pressure (1 atm).

The elastomer resin in the heat-conducting resin sheet of the present invention preferably includes a liquid elastomer in view of improving the flexibility of the heat-conducting resin sheet. The liquid elastomer resin is not particularly limited, and a liquid resin among the elastomer resins listed above can be used, for example. Among others, preferred are liquid acrylonitrile butadiene rubber, liquid ethylene-propylene-diene rubber, liquid polyisoprene rubber, and liquid polybutadiene rubber. The elastomer resins may be used singly or in combinations of two or more thereof.

The liquid elastomer resin preferably has a viscosity at 25° C. of 1 to 150 Pa·s and more preferably 10 to 100 Pa·s. In a case where two or more liquid elastomer resins are mixed and used, the viscosity after mixing is preferably as described above. When the viscosity is within the above-described range, bleeding of oil tends to be suppressed, and contamination therewith of an electronic component as an adherend is easily prevented.

In a case where the liquid elastomer is used, the content of the liquid elastomer is preferably 60% by mass or more, more preferably 90% by mass or more, and even more preferably 100% by mass, based on the whole amount of the elastomer resin.

The kind of the acrylic resin is not particularly limited, and the acrylic resin is a polymer obtained by polymerizing a monomer including an acrylate, a methacrylate, or both of them. Hereinafter, either one or both of an acrylate and a methacrylate are collectively referred to as (meth)acrylate.

The acrylic resin generally has a constituent unit derived from an alkyl (meth)acrylate. The alkyl (meth)acrylate used is generally has an alkyl group having 12 or less carbon atoms, and preferably has an alkyl group having 3 to 12 carbon atoms. Specific examples thereof include alkyl (meth)acrylates, such as n-propyl (meth)acrylate, n-butyl (meth)acrylate, n-amyl (meth)acrylate, n-hexyl (meth)acrylate, 2-ethylhexyl (meth)acrylate, n-octyl (meth)acrylate, isooctyl (meth)acrylate, n-nonyl (meth)acrylate, isononyl (meth)acrylate, and n-decyl (meth)acrylate.

The acrylic resins may be used singly or in combinations of two or more thereof.

The kind of the silicone resin is not particularly limited and may be either a condensation cured silicone resin or an addition cured silicone resin, and preferred is an addition cure silicone resin. The silicone resin is preferably one obtained by crosslinking and curing a silicone compound with a crosslinking agent. The silicone compound used is preferably an organopolysiloxane having two or more alkenyl groups such as vinyl groups, and more preferably an organopolysiloxane having vinyl groups on both terminals, respectively. Examples of the organopolysiloxane having vinyl groups on both terminals, respectively, include vinyl-terminated polydimethylsiloxane, vinyl-terminated polyphenylmethylsiloxane, vinyl-terminated dimethylsiloxane-diphenylsiloxane copolymer, vinyl-terminated dimethylsiloxane-phenylmethylsiloxane copolymer, and vinyl-terminated dimethylsiloxane-diethylsiloxane copolymer.

The crosslinking agent is not particularly limited as long as it can crosslink the silicone compound described above, and examples thereof include a compound having two or more hydrosilyl groups (SiH). Among others, polyorganosiloxane having two or more hydrosilyl groups (hereinafter, also referred to as "hydrosilyl groups-containing polyorganosiloxane") is preferable.

Examples of the hydrosilyl groups-containing polyorganosiloxane include methylhydrosiloxane-dimethylsiloxane copolymer, polymethylhydrosiloxane, polyethylhydrosiloxane, and methylhydrosiloxane-phenylmethylsiloxane copolymer. These may or may not contain the hydrosilyl group at its terminal. For example, it may be terminated by a trimethylsilyl group, triethylsilyl group, or the like, at each of both terminals.

The silicone resins may be used singly or in combinations of two or more thereof.

The volume of the resin in the heat-conducting resin sheet is preferably 10 to 70% by volume, more preferably 20 to 60% by volume, and even more preferably 30 to 50% by volume.

<Other Additives>

The heat-conducting resin sheet of the present invention may include additives generally used for a heat-conducting resin sheet, such as an antioxidant, a heat stabilizer, a colorant, a flame retardant, an antistatic agent, a filler other than the thermally conductive particles described hereinabove, and a decomposition temperature regulator, if necessary.

<Orientation>

In the heat-conducting resin sheet, the major axis of the thermally conductive plate-shaped particle is preferably oriented at an angle more than 45° with the surface of the sheet serving as the surface of the heat-conducting resin sheet, and it is more preferably oriented at an angle of 50° or more, even more preferably 60° or more, even more preferably 70° or more, and even more preferably 80° or more. In a case where the thermally conductive plate-shaped particle is oriented in this manner, the heat-conducting resin sheet has an increased thermal conductivity in the thickness direction. Furthermore, even when the amount of the thermally conductive particles used is a relatively small amount, the thermal conductivity can be improved, and accordingly, it is easy to improve both of the thermal conductivity and the flexibility of the heat-conducting resin sheet. The direction of the major axis of the thermally conductive plate-shaped particle corresponds to the direction of the longest length of the thermally conductive plate-shaped particle described hereinabove.

The angle can be measured through observation of a cross section of the heat-conducting resin sheet in the thickness direction under a scanning electron microscope. For example, a thin slice is prepared from the center portion of the heat-conducting resin sheet in the thickness direction. Then, the thermally conductive plate-shaped particle in the thin slice is observed under a scanning electron microscope (SEM) at a magnification of 3000×, and the angle of the major axis of the thermally conductive plate-shaped particle thus observed with the surface of the sheet is measured to determine the angle of the orientation. Herein, the angle of 45°, 50°, 60°, 70°, 80° or more means that the average of the values measured in the above-described manner is that angle or larger. For example, an expression "oriented at an angle of 700 or more" does not exclude the presence of a thermally conductive plate-shaped particle with an angle of orientation of less than 700 since 700 is the average. When the angle is more than 90°, the supplementary angle is regarded as the measured value.

(Compressive Strength Ratio)

The heat-conducting resin sheet of the present invention preferably has compressive strength B/compressive strength A of 2 or less, or compressive strength C/compressive strength B of 2 or less, where compressive strength A is the 30% compressive strength as measured at a compression rate of 0.1 mm/min, compressive strength B is the 30% compressive strength as measured at a compression rate of 1.0 mm/min, and compressive strength C is a 30% compressive strength as measured at a compression rate of 10.0 mm/min.

Compressive strength B/compressive strength A represents the ratio of compressive strength B to compressive strength A, and similarly, compressive strength C/compressive strength B represents the ratio of compressive strength C to compressive strength B. As these compressive strength ratios are smaller, the degree of the increase in the stress is smaller when the heat-conducting resin sheet is quickly compressed.

Accordingly, when the heat-conducting resin sheet satisfies the values of the above-described compressive strength ratios, the increase in the stress upon quick compression is likely to be suppressed. It is more preferable that not only compressive strength B/compressive strength A is 2 or less, but also compressive strength C/compressive strength B is 2 or less, in view of more efficiently suppressing the increase in the stress upon quick compression of the heat-conducting resin sheet. From the same point of view, compressive strength B/compressive strength A is preferably 1.8 or less, more preferably 1.6 or less, and generally 1.0 or more. From the same point of view, compressive strength C/compressive strength B is preferably 1.8 or less, more preferably 1.6 or less, and generally 1.0 or more.

(Heat Resistance Under 10% Compression)

The heat-conducting resin sheet of the present invention preferably has a heat resistance of 5 K/W or less under 10% compression. In a case where the heat resistance is 5 K/W or less under 10% compression, the heat-conducting resin sheet exhibits the improved dissipating property when it is used in a compressed state. In view of more improving the dissipating property, the heat resistance is preferably 4 K/W or less, and even more preferably 3 K/W or less, under 10% compression. The heat resistance under 10% compression can be measured by the method described in Examples.

(Gel Fraction)

The heat-conducting resin sheet of the present invention is preferably a crosslinked heat-conducting resin sheet, and therefore, preferably has a gel fraction within a certain range.

In view of favorable flexibility, the gel fraction of the heat-conducting resin sheet is preferably 50% by mass or less, and more preferably 40% by mass or less. The gel fraction is preferably 5% by mass or more, and preferably 10% by mass or more, in view of, for example, ensuring a certain mechanical strength and reducing the change in the physical properties over long period of use.

(Laminated Body)

The heat-conducting resin sheet of the present invention may be a single layer or may be a laminated body. In view of favorable thermal conductivity, the heat-conducting resin sheet is preferably a laminated body obtained by laminating resin layers including the thermally conductive plate-shaped particle, the thermally conductive spherical particle, and the resin. Now, description will be given for one exemplary embodiment of the laminated body obtained by laminating resin layers including the thermally conductive plate-shaped particle, the thermally conductive spherical particle, and the resin, with reference to FIG. 1.

In each drawing, a thermally conductive plate-shaped particle overlaps another particle adjacent above or below; however, the thermally conductive plate-shaped particles do not necessarily overlap each other.

As shown in FIG. 1, the heat-conducting resin sheet 1 has a structure in which a plurality of resin layers 2 are laminated. The plane perpendicular to the laminated planes of the resin layers 2 is the surface of the sheet 5, which serves as the surface of the resin sheet 1.

The thickness of the heat-conducting resin sheet 1, T1 (or in other words, the distance between a surface of the sheet 5 and another surface of the sheet 5) is not particularly limited, and may be, for example, within a range from 0.1 to 30 mm.

The thickness of a single resin layer 2 (the width of the resin layer, W1) is not particularly limited, and can be preferably 1000 μm or less, more preferably 500 μm or less, and preferably 0.1 μm or more, more preferably 0.5 μm or more, even more preferably 1 μm or more. The thermal conductivity can be enhanced by thus regulating the thickness.

The resin layer 2 is a heat-conducting resin layer 7 including a thermally conductive plate-shaped particle 6, a thermally conductive spherical particle 9, and a resin 8. The heat-conducting resin layer 7 has a structure in which the thermally conductive plate-shaped particle 6 and the thermally conductive spherical particle 9 are dispersed in the resin 8.

In each resin layer 2, the major axis of the thermally conductive plate-shaped particle 6 is oriented at an angle of more than 45°, and more preferably at an angle of 50° or more, even more preferably 60° or more, even more preferably 70° or more, and even more preferably 80° or more, to the surface of the sheet, as described hereinabove.

The thickness of the heat-conducting resin layer 7 is preferably 1 to 1000 times, and more preferably 1 to 500 times as large as the thickness of the thermally conductive plate-shaped particle 6 included in the heat-conducting resin layer 7.

When the thickness (width) of the heat-conducting resin layer 7 is within the range described above, the major axis of the thermally conductive plate-shaped particle 6 is likely to be oriented at an angle close to 90° with the surface of the sheet. The width of the heat-conducting resin layer 7 may be not uniform as long as it is within the range described above.

[Method for Producing Heat-Conducting Resin Sheet]

The method for producing the heat-conducting resin sheet of the present invention is not particularly limited. For example, when a single layer heat-conducting resin sheet is produced, the heat-conducting resin sheet may be formed by feeding the thermally conductive plate-shaped particle, the thermally conductive spherical particle, the resin, and additives, if necessary, to an extruder, melt-kneading them, and extruding the resulting mixture, a heat-conducting resin composition, from the extruder into a sheet shape.

(Method for Producing Laminated Body)

The method for producing a heat-conducting resin sheet of the present invention consisting of a laminated body is not particularly limited, and may be produced by a method including the kneading step, the laminating step, and further the slicing step, if necessary, as described below.

<Kneading Step>

The thermally conductive plate-shaped particle, the thermally conductive spherical particle, the resin, and additives, added if necessary, are kneaded to prepare a heat-conducting resin composition.

As the kneading, the thermally conductive fillers and the resin are preferably kneaded, for example, under heating using a twin-screw kneader, such as plastomill, or a twin-screw extruder, whereby a heat-conducting resin composition can be obtained in which the thermally conductive fillers are uniformly dispersed in the resin.

Then, the heat-conducting resin composition can be pressed to thereby obtain a resin layer (heat-conducting resin layer) in a sheet shape.

<Laminating Step>

In the laminating step, the resin layers obtained from the above-described kneading step are laminated to prepare a laminated body of an n-layer structure. A method usable as the lamination method is, for example, a method in which the resin layer manufactured in the kneading step is divided into $x_i$ and laminated to manufacture a laminated body having an $x_i$-layer structure, then hot-pressed as needed, subsequently the division, the lamination and the hot-pressing are further repeated as needed to manufacture a laminated body having a width of D μm and an n-layer structure.

In a case where the thermally conductive filler has a plate shape, the width of the laminated body, W2 (D μm) after the laminating step and the thickness of the thermally conductive plate-shaped particle (d μm) preferably satisfy $0.0005\ d/(D/n) \leq 1$, more preferably $0.001\ d/(D/n) \leq 1$, and even more preferably $0.02 \leq d/(D/n) \leq 1$.

In a case where shaping in such a manner is carried out more than once, the pressure for shaping in each time can be small as compared to a case where shaping is completed in one time, and accordingly, a phenomenon of breakage or the like of the laminated structure due to shaping can be avoided.

As the laminating method, another method can be used that includes, for example, using an extruder including a multilayer-molding block, adjusting the multilayer-molding block, and co-extruding to thereby obtain a laminated body of the n-layer structure and the thickness of D μm as described above.

Specifically, the heat-conducting resin composition obtained from the kneading step is introduced into both the first extruder and the second extruder, and the heat-conducting resin composition is extruded from the first extruder and the second extruder simultaneously. The heat-conducting resin compositions extruded from the first extruder and the second extruder, respectively, are conveyed to a feed block. In the feed block, the heat-conducting resin compositions extruded from the first extruder and the second extruder, respectively, are joined. Thus, a bilayer product can be obtained in which the heat-conducting resin compositions are laminated. Then, the bilayer product can be conveyed to a multilayer-molding block, and divided into a plurality of pieces along planes in the direction parallel to the extruded direction and also perpendicular to the laminating planes, and the resulting pieces can be laminated to prepare a laminated body of an n-layer structure with a thickness of D μm. At this time, the thickness per layer (D/n) can be adjusted to a desirable value by adjusting the multilayer-molding block.

(Slicing Step)

The laminated body obtained from the laminating step can be sliced in the direction parallel to the laminating direction to thereby prepare a heat-conducting resin sheet.

(Other Step)

The method for producing the heat-conducting resin sheet preferably include the step of crosslinking the resin. Crosslinking tends to result in a small change in the physical properties when use. Crosslinking can be carried out by, for example, a method involving irradiation with ionizing radiation such as electron beams, α-rays, β-rays, and γ-rays, or a method involving use of an organic peroxide. In a case where the resin is crosslinked by irradiation with ionizing radiation, the sheet surface (surface of the sheet) is preferably irradiated with to the ionizing radiation after the slicing step described above, and the electron beam is preferable in ionizing radiation. In irradiation with the electron beam, the accelerating voltage is preferably 50 to 800 kV. An irradiation dose of the electron beam is preferably 50 to 700 kGy.

The heat-conducting resin sheet of the present invention is excellent in the thermal conductivity and flexibility and suppress the increase in the stress when compressed quickly. Accordingly, the heat-conducting resin sheet of the present invention can be compressed and disposed between a heating element and a heat sink inside an electronic device to accelerate heat dissipation from the heating element to the heat sink, for example. In addition, when disposed between a heating element and a heat sink inside, the heat-conducting resin sheet of the present invention can be compressed quickly (for example, at a compression rate greater than 1.0 mm/min, and preferably a compression rate 1.5 mm/min or more) to be disposed, which improves the productivity.

A mode of the heat-conducting resin sheet disposed between a heating element and a heat sink will be described by way of the heat-conducting resin sheet 1 described in FIG. 1.

Figure 2:
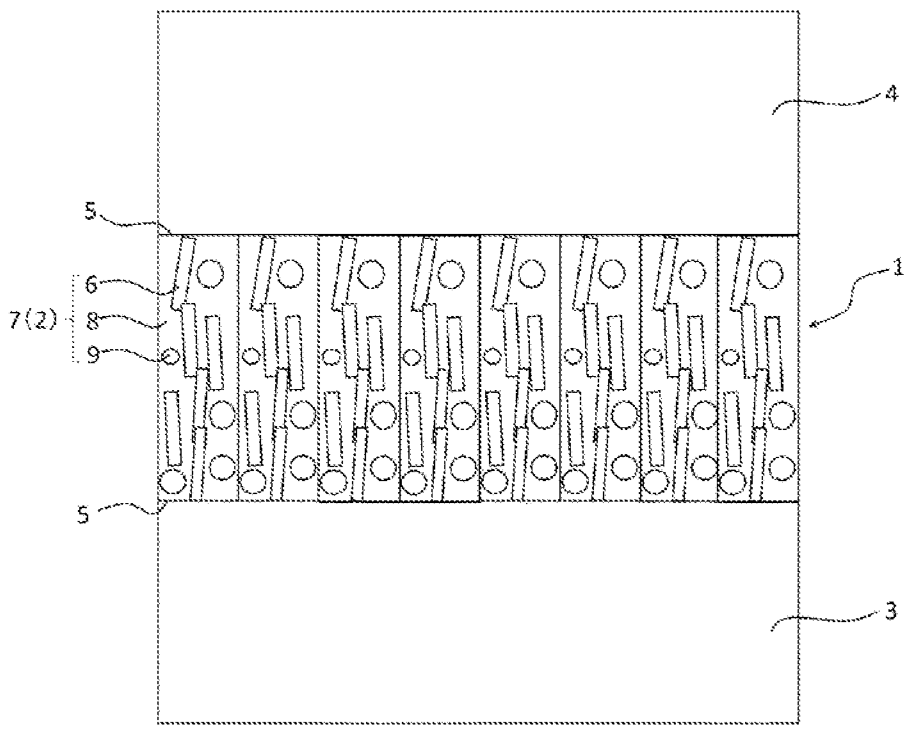
FIG. 2 is an illustrative cross-sectional view of a heat-conducting resin sheet consisting of a laminated body, in usage state.

As shown in FIG. 2, the heat-conducting resin sheet 1 is disposed such that the surfaces of the sheet 5 are brought into contact with the heating element 3 and the heat sink 4, respectively. The heat-conducting resin sheet 1 is disposed in a compressed state between two members such as the heating element 3 and the heat sink 4. The heating element 3 is a semiconductor package, for example, and the heat sink 4 is a metal such as aluminum or copper, for example. When the heat-conducting resin sheet 1 is used in such a manner, heat generated in the heating element 3 easily dissipates to the heat sink 4, and efficient heat dissipation is achieved.

EXAMPLES

The present invention will be described in more detail by way of examples, but the present invention is not limited by these examples at all.

The material used in Examples and Comparative Examples below were as follows.

Resin

Liquid elastomer 1: liquid polybutadiene rubber, product name "L-1203", manufactured by KURARAY CO., LTD.

Silicone resin: product name "SEMICOSIL 962TC", manufactured by wacker asahikasei silicone co., ltd.

Acrylic resin: product name "SG-280 EK23", manufactured by Nagase ChemteX Corporation (2) Thermally conductive spherical particle (i) Alumina, "TM2410" manufactured by HUBER
Aspect ratio: 1.5
Average particle size: 3.5 μm
Thermal conductivity=35 W/mK (ii) Aluminum nitride, "HF-05" manufactured by Tokuyama Corporation
Aspect ratio: 1.5
Average particle size: 4.5 μm
Thermal conductivity=250 W/mK (iii) Aluminum hydroxide, "BF013" manufactured by Nippon Light Metal Co., Ltd
Aspect ratio: 1.5
Average particle size: 1 μm
Thermal conductivity=30 W/mK (iv) Magnesium oxide 1, "PYROKISUMA 3320" manufactured by Kyowa Chemical Industry Co., Ltd.
Aspect ratio: 1.5
Average particle size: 17 μm
Thermal conductivity=50 W/mK (v) Magnesium oxide 2, "PYROKISUMA 5301" manufactured by Kyowa Chemical Industry Co., Ltd.
Aspect ratio: 1.5
Average particle size: 2.9 μm
Thermal conductivity=50 W/mK (3) Thermally conductive plate-shaped particle (i) Boron nitride 1 (scale shape), "SGP", manufactured by Denka Company Limited.
Aspect ratio: 81
Average particle size: 18 μm
Thermal conductivity in plane direction=250 W/mK
Thermal conductivity in thickness direction=3 W/mK (ii) Boron nitride 2 (scale shape), "MGP", manufactured by Denka Company Limited.
Aspect ratio: 41
Average particle size: 13 μm
Thermal conductivity in plane direction=250 W/mK
Thermal conductivity in thickness direction=3 W/mK Various physical properties and the evaluation methods are as follows.

<Angle of Orientation>

The cross section of the heat-conducting resin sheet was observed under a scanning electron microscope (S-4700, manufactured by Hitachi, Ltd.). For twenty arbitrary thermally conductive plate-shaped particles in the observation image at a magnification of 3000×, the angle of each major axis with the surface of the sheet was measured, and the average thereof was used as the angle of the orientation.

<Thermal Conductivity>

The thermal conductivity in the thickness direction of the heat-conducting resin sheet obtained was measured using a laser flash thermal constant analyzer ("LFA 447", manufactured by NETZSCH).

<Heat Resistance Under 10% Compression>

The heat resistance of the heat-conducting resin sheet under 10% compression was measured on a sample in a condition under 10% compression by a steady method in accordance with ASTM D5470 using "T3Ster (registered trademark) DynTIM Tester" (product name) manufactured by Mentor Graphics.

<10%, 30%, 40% Compressive Strengths, Compressive Strength Ratio>

The 10%, 30%, 40% compressive strengths of the heat-conducting resin sheet obtained were measured using "RTG-1250" manufactured by A&D Company, Limited. The measurement was carried out under the conditions of a sample size of 2 mm×15 mm×15 mm, a measurement temperature of 23° C., and a compression rate of 1 mm/min. In addition, the condition of the compression rate was changed to 0.1 mm/min and 10.0 mm/min, and the 30% compressive rate was measured under each condition. Then, the values of compressive strength B/compressive strength A and compressive strength C/compressive strength B were determined.

<Installation Test>

(1) Evaluation for Installation

A installation test was carried out such that the heat-conducting resin sheet obtained was installed under 30% compression on a BGA (Ball Grid Array) substrate for test, and whether there were any faults after installation, such as solder cracks and short circuit, was observed using an X-ray device or in terms of an electrical resistance. The evaluation was made on the following evaluation criteria. In the installation test, evaluations were made under the conditions of compressing to 30% at a compression rate of 0.1 mm/min, 1.0 mm/min, and 10.0 mm/min, respectively, and the conditions of compressing to 10%, 30%, and 40%, respectively, at a compression rate of 1.0 mm/min.

A: Installation was possible with no faults.

B: Installation was possible but fault or increase in the electrical resistance was found.

C: Installation was impossible.

<Evaluation for Heat Dissipation>

Evaluation for heat dissipation was carried out for the heat-conducting resin sheet under 10% compression. When the compressive strength is more than 2500 kPa, the sheet has poor flexibility and is difficult to use as a heat-conducting resin sheet, and accordingly, such a sheet was rated as "NG", as described below, regardless of the heat resistance.

A: The heat resistance is 5 K/W or less, and the compressive strength is 2500 kPa or less.

C: The heat resistance is more than 5 K/W, and the compressive strength is 2500 kPa or less.

NG: The compressive strength is more than 2500 kPa.

Example 1

A mixture consisting of 100 parts by mass of liquid elastomer 1 (product name "L-1203", manufactured by KURARAY CO., LTD.), 360 parts by mass of alumina (product name "TM2410", manufactured by HUBER), and 100 parts by mass of Boron nitride 1 (product name "SGP", manufactured by Denka Company Limited) was melt and kneaded to prepare a heat-conducting resin composition. The composition was pressed to obtain a resin layer in a sheet shape having a thickness of 0.5 mm, a width of 80 mm, and a length of 80 mm. Next, in the laminating step, the resulting resin layer was divided equally into 16 pieces, and these pieces were laminated on top of one another to obtain a laminated body consisting of 16 resin layers and having a total thickness of 8 mm, a width of 20 mm, and a length of 20 mm. Then, the laminated body was sliced parallel to the laminating direction to obtain a heat-conducting resin sheet having a thickness of 2 mm, a width of 8 mm, and a length of 20 mm. A single layer of the resin layers constituting the laminated body as the heat-conducting resin sheet had a thickness of 0.5 mm. Then, both surfaces of the heat-conducting resin sheet were each irradiated with an electron beam at an accelerating voltage of 525 kV and a radiation dose of 600 kGy to thereby crosslink the sheet. The resulting heat-conducting resin sheet was evaluated for each of the items in Table 1.

Examples 2 to 8, Comparative Examples 1 to 4

A heat-conducting resin sheet was obtained in the same manner as in Example 1, except that the kinds and the amounts of the resin and the thermally conductive particles were changed as shown in Table 1 and Table 2. The resulting heat-conducting resin sheet was evaluated for each of the items in the Tables.

Examples 9 to 10, Comparative Examples 5 to 6

A heat-conducting resin sheet was obtained in the same manner as in Example 1, except that the kinds and the amounts of the resin and the thermally conductive particles were changed as shown in Table 1 and Table 2, and that irradiation with the electron beam was not carried out.

TABLE 1

| | | | | Example | | | | |
|---|---|---|---|---|---|---|---|---|
| | | | | 1 | 2 | 3 | 4 | 5 |
| Heat-conducting resin composition (parts by mass) | Resin | | Liquid elastomer 1 (L-1203) | 100 | 100 | 100 | 100 | 100 |
| | | | Silicone resin | | | | | |
| | | | Acrylic resin | | | | | |
| | Thermally conductive particle | Spherical | Alumina TM2410 | 360 | 70 | | | |
| | | | Aluminum nitride, HF-05 | | | 190 | | |
| | | | Aluminum hydroxide, BF013 | | | | 200 | |
| | | | Magnesium oxide 1 PYROKISUMA 3320 | | | | | 330 |
| | | | Magnesium oxide 2 PYROKISUMA 5301 | | | | | |
| | | Plate-shaped | Boron nitride 1 (scale shape), SGP | 100 | 270 | 190 | | 100 |
| | | | Boron nitride 2 (scale shape), MGP | | | | 150 | |
| Conditions of irradiation with ionizing radiation when producing heat-conducting resin sheet | | | | 525 kV 600 kGy | 525 kV 600 kGy | 525 kV 600 kGy | 525 kV 600 kGy | 525 kV 600 kGy |
| Formulation of heat-conducting resin sheet | | | Thermally conductive spherical particle/whole of heat-conducting resin sheet (% by volume) | 36.6 | 7.1 | 22.8 | 31.5 | 36.4 |
| | | | Thermally conductive plate-shaped particle/whole of heat-conducting resin sheet (% by volume) | 17.7 | 47.5 | 32.7 | 25.2 | 17.8 |
| | | | Whole of thermally conductive particles/whole of heat-conducting resin sheet (% by volume) | 54.3 | 54.6 | 55.5 | 56.7 | 54.2 |

TABLE 1-continued

| | | | | | | |
|---|---|---|---|---|---|---|
| | Thermally conductive spherical particle/whole of thermally conductive particles (% by volume) | 67 | 13 | 41 | 56 | 67 |
| | Thermally conductive plate-shaped particle/whole of thermally conductive particles (% by volume) | 33 | 87 | 59 | 44 | 33 |
| | Volume of thermally conductive plate-shaped particle/volume of thermally conductive spherical particle | 33/67 | 87/13 | 59/41 | 44/56 | 33/67 |
| Evaluation of heat-conducting resin sheet | Angle of orientation [°] | 75 | 78 | 74 | 73 | 73 |
| | Thermal conductivity [W/mK] | 5.2 | 10.3 | 9.1 | 8.1 | 5.7 |
| | Average filler aspect ratio | 27.4 | 70.7 | 48.4 | 19.1 | 27.5 |
| | Heat resistance under 10% compression [K/W] | 3.75 | 2.40 | 2.54 | 2.72 | 3.59 |
| | 30% Compressive strength A (Compression rate 0.1 mm/min) [kPa] | 1010 | 500 | 860 | 1010 | 1050 |
| | 30% Compressive strength B (Compression rate 1.0 mm/min) [kPa] | 1150 | 950 | 1190 | 1350 | 1250 |
| | 30% Compressive strength C (Compression rate 10.0 mm/min) [kPa] | 1290 | 1800 | 1680 | 1880 | 1400 |
| | 10% Compressive strength (Compression rate 1.0 mm/min) [kPa] | 510 | 430 | 570 | 660 | 610 |
| | 40% Compressive strength (Compression rate 1.0 mm/min) [kPa] | 1690 | 1400 | 1740 | 2030 | 1900 |
| | Compressive strength B/ Compressive strength A | 1.14 | 1.90 | 1.38 | 1.34 | 1.19 |
| | Compressive strength C/ Compressive strength B | 1.12 | 1.89 | 1.41 | 1.39 | 1.12 |
| | Installation test (Compression rate 0.1 mm/min. 30% compression) | A | A | A | A | A |
| | Installation test (Compression rate 1.0 mm/min. 30% compression) | A | A | A | A | A |
| | Installation test (Compression rate 10 mm/min. 30% compression) | A | A | A | A | A |
| | Installation test (Compression rate 1.0 mm/min. 10% compression) | A | A | A | A | A |
| | Installation test (Compression rate 1.0 mm/min. 30% compression) | A | A | A | A | A |
| | Installation test (Compression rate 1.0 mm/min. 40% compression) | A | A | A | A | A |
| | Evaluation for heat dissipation (10% compression) | A | A | A | A | A |

| | | | | Example | | | | |
|---|---|---|---|---|---|---|---|---|
| | | | | 6 | 7 | 8 | 9 | 10 |
| Heat-conducting resin composition (parts by mass) | Resin | | Liquid elastomer 1 (L-1203) | 100 | 100 | 100 | | |
| | | | Silicone resin | | | | 100 | |
| | | | Acrylic resin | | | | | 100 |
| | Thermally conductive particle | Spherical | Alumina TM2410 | | | | | |
| | | | Aluminum nitride, HF-05 | | | | | |
| | | | Aluminum hydroxide, BF013 | | | | | |
| | | | Magnesium oxide 1 PYROKISUMA 3320 | 70 | | | | |
| | | | Magnesium oxide 2 PYROKISUMA 5301 | | 330 | 60 | 130 | 150 |
| | | Plate-shaped | Boron nitride 1 (scale shape), SGP | 280 | | | 130 | 150 |
| | | | Boron nitride 2 (scale shape), MGP | | 100 | 260 | | |
| Conditions of irradiation with ionizing radiation when producing heat-conducting resin sheet | | | | 525 kV 600 kGy | 525 kV 600 kGy | 525 kV 600 kGy | — | — |
| Formulation of heat-conducting resin sheet | | | Thermally conductive spherical particle/whole of heat-conducting resin sheet (% by volume) | 7.5 | 36.4 | 6.7 | 21.3 | 21.4 |
| | | | Thermally conductive plate-shaped particle/whole of heat-conducting resin sheet (% by volume) | 48.2 | 17.8 | 46.8 | 34.3 | 34.4 |
| | | | Whole of thermally conductive particles/whole of heat-conducting resin sheet (% by volume) | 55.6 | 54.2 | 53.5 | 55.6 | 55.8 |

TABLE 1-continued

| | | | | | | |
|---|---|---|---|---|---|---|
| | Thermally conductive spherical particle/whole of thermally conductive particles (% by volume) | 13 | 67 | 13 | 38 | 38 |
| | Thermally conductive plate-shaped particle/whole of thermally conductive particles (% by volume) | 87 | 33 | 87 | 62 | 62 |
| | Volume of thermally conductive plate-shaped particle/volume of thermally conductive spherical particle | 87/13 | 33/67 | 87/13 | 62/38 | 62/38 |
| Evaluation of heat-conducting resin sheet | Angle of orientation [°] | 75 | 74 | 77 | 74 | 73 |
| | Thermal conductivity [W/mK] | 11.2 | 5.5 | 10.7 | 9.2 | 9.3 |
| | Average filler aspect ratio | 70.3 | 14.4 | 36.0 | 50.5 | 50.5 |
| | Heat resistance under 10% compression [K/W] | 2.34 | 3.63 | 2.38 | 2.52 | 2.49 |
| | 30% Compressive strength A (Compression rate 0.1 mm/min) [kPa] | 600 | 1210 | 560 | 850 | 930 |
| | 30% Compressive strength B (Compression rate 1.0 mm/min) [kPa] | 980 | 1450 | 1100 | 1320 | 1470 |
| | 30% Compressive strength C (Compression rate 10.0 mm/min) [kPa] | 1830 | 1740 | 2140 | 1860 | 2300 |
| | 10% Compressive strength (Compression rate 1.0 mm/min) [kPa] | 510 | 720 | 530 | 620 | 720 |
| | 40% Compressive strength (Compression rate 1.0 mm/min) [kPa] | 1500 | 2350 | 1610 | 1990 | 2210 |
| | Compressive strength B/ Compressive strength A | 1.63 | 1.20 | 1.96 | 1.55 | 1.58 |
| | Compressive strength C/ Compressive strength B | 1.87 | 1.20 | 1.95 | 1.41 | 1.56 |
| | Installation test (Compression rate 0.1 mm/min. 30% compression) | A | A | A | A | A |
| | Installation test (Compression rate 1.0 mm/min. 30% compression) | A | A | A | A | A |
| | Installation test (Compression rate 10 mm/min. 30% compression) | A | A | A | A | A |
| | Installation test (Compression rate 1.0 mm/min. 10% compression) | A | A | A | A | A |
| | Installation test (Compression rate 1.0 mm/min. 30% compression) | A | A | A | A | A |
| | Installation test (Compression rate 1.0 mm/min. 40% compression) | A | A | A | A | A |
| | Evaluation for heat dissipation (10% compression) | A | A | A | A | A |

TABLE 2

| | | | | Comparative Example | | | | | |
|---|---|---|---|---|---|---|---|---|---|
| | | | | 1 | 2 | 3 | 4 | 5 | 6 |
| Heat-conducting resin composition (parts by mass) | Resin | | Liquid elastomer 1 (L-1203) | 100 | 100 | 100 | 100 | | |
| | | | Silicone resin | | | | | 100 | |
| | | | Acrylic resin | | | | | | 100 |
| | Thermally conductive particle | Spherical | Alumina TM2410 | 600 | | | | | |
| | | | Aluminum nitride, HF-05 | | | | | | |
| | | | Aluminum hydroxide, BF013 | | | | | | |
| | | | Magnesium oxide 1 PYROKISUMA 3320 | | | | | | |
| | | | Magnesium oxide 2 PYROKISUMA 5301 | | | 30 | 450 | 20 | 350 |
| | | Plate-shaped | Boron nitride 1 (scale shape), SGP | | 300 | | | | |
| | | | Boron nitride 2 (scale shape), MGP | | | 280 | 100 | 200 | 80 |
| Conditions of irradiation with ionizing radiation when producing heat-conducting resin sheet | | | | 525 kV 600 kGy | 525 kV 600 kGy | 525 kV 600 kGy | 525 kV 600 kGy | — | — |
| Formulation of heat-conducting resin sheet | | | Thermally conductive spherical particle/whole of heat-conducting resin sheet (% by volume) | 57.2 | 0.0 | 3.4 | 43.9 | 3.3 | 44.4 |
| | | | Thermally conductive plate-shaped particle/whole of heat-conducting resin sheet (% by volume) | 0.0 | 53.8 | 50.3 | 15.7 | 52.6 | 16.3 |
| | | | Whole of thermally conductive particles/whole of heat-conducting resin sheet (% by volume) | 57.2 | 53.8 | 53.7 | 59.6 | 55.8 | 60.7 |

TABLE 2-continued

| | | Comparative Example | | | | | |
|---|---|---|---|---|---|---|---|
| | | 1 | 2 | 3 | 4 | 5 | 6 |
| Evaluation of heat-conducting resin sheet | Thermally conductive spherical particle/whole of thermally conductive particles (% by volume) | 100 | 0 | 6 | 74 | 6 | 73 |
| | Thermally conductive plate-shaped particle/whole of thermally conductive particles (% by volume) | 0 | 100 | 94 | 26 | 94 | 27 |
| | Volume of thermally conductive plate-shaped particle/volume of thermally conductive spherical particle | 0/100 | 100/0 | 94/6 | 26/74 | 94/6 | 27/73 |
| | Angle of orientation [°] | — | 81 | 76 | 71 | 77 | 71 |
| | Thermal conductivity [W/mK] | 2.4 | 12.1 | 11.9 | 5.2 | 12.1 | 5.3 |
| | Average filler aspect ratio | 1.5 | 81.0 | 38.5 | 11.9 | 38.7 | 12.1 |
| | Heat resistance under 10% compression [K/W] | 6.69 | 2.21 | 2.24 | 3.77 | 2.22 | 3.73 |
| | 30% Compressive strength A (Compression rate 0.1 mm/min) [kPa] | 450 | 690 | 700 | 1630 | 710 | 1620 |
| | 30% Compressive strength B (Compression rate 1.0 mm/min) [kPa] | 480 | 1420 | 1450 | 1750 | 1490 | 1780 |
| | 30% Compressive strength C (Compression rate 10.0 mm/min) [kPa] | 520 | 2950 | 2970 | 1850 | 3100 | 1940 |
| | 10% Compressive strength (Compression rate 1.0 mm/min) [kPa] | 240 | 740 | 780 | 890 | 820 | 910 |
| | 40% Compressive strength (Compression rate 1.0 mm/min) [kPa] | 730 | 1990 | 2050 | 2780 | 2210 | 2850 |
| | Compressive strength B/ Compressive strength A | 1.07 | 2.06 | 2.07 | 1.07 | 2.10 | 1.10 |
| | Compressive strength C/ Compressive strength B | 1.08 | 2.08 | 2.05 | 1.06 | 2.08 | 1.09 |
| | Installation test (Compression rate 0.1 mm/min. 30% compression) | A | A | A | A | A | A |
| | Installation test (Compression rate 1.0 mm/min. 30% compression) | A | A | A | A | A | A |
| | Installation test (Compression rate 10 mm/min. 30% compression) | A | C | C | A | C | A |
| | Installation test (Compression rate 1.0 mm/min. 10% compression) | A | A | A | A | A | A |
| | Installation test (Compression rate 1.0 mm/min. 30% compression) | A | A | A | A | A | A |
| | Installation test (Compression rate 1.0 mm/min. 40% compression) | A | A | A | C | A | C |
| | Evaluation for heat dissipation (10% compression) | C | A | A | A | A | A |

It was seen that the heat-conducting resin sheet of the present invention illustrated in each of Examples had a thermal conductivity and a 30% compressive strength within the respective specific ranges, and was therefore excellent in both thermal conductivity and flexibility. Furthermore, it was seen that the installation was appropriate when the heat-conducting resin sheet was installed at any of various compression rates, and that the increase in the stress when the sheet was compressed quickly was thus suppressed.

In contrast, it was seen that the heat-conducting resin sheet illustrated in each of Comparative Examples had a poor result in the evaluation for heat dissipation, or a poor result in the evaluation for installation, and specifically, caused large increase in the stress when compressed quickly.

REFERENCE SIGNS LIST

1 heat-conducting resin sheet
2 resin layer
3 heating element
4 heat sink
5 surface of sheet
6 thermally conductive plate-shaped particle
7 heat-conducting resin layer
8 resin
9 thermally conductive spherical particle

The invention claimed is:

1. A heat-conducting resin sheet comprising a thermally conductive plate-shaped particle, a thermally conductive spherical particle, and a resin, wherein the thermally conductive spherical particle comprises at least one selected from aluminum oxide, magnesium oxide, aluminum nitride, and aluminum hydroxide, wherein the resin comprises at least one selected from an elastomer resin, an acrylic resin, and a silicone resin, wherein the heat-conducting resin sheet has a thermal conductivity of 5 W/m·K or more and a 30% compressive strength B of 1500 kPa or less as measured at a compression rate of 1.0 mm/min, wherein a volume ratio of the thermally conductive plate-shaped particle to the thermally conductive spherical particle (volume of thermally conductive plate-shaped particle/volume of thermally conductive spherical particle) is 30/70 to 90/10, wherein a total volume of the thermally conductive plate-shaped particle and the thermally conductive spherical particle is 30 to 90% by volume, and wherein a volume of the thermally conductive plate-shaped particle is 15 to 50% by volume in the heat-conducting resin sheet.

2. A heat-conducting resin sheet comprising a thermally conductive plate-shaped particle, a thermally conductive spherical particle, and a resin, wherein the thermally conductive spherical particle comprises at least one selected from aluminum oxide, magnesium oxide, aluminum nitride, and aluminum hydroxide, wherein the resin comprises at least one selected from an elastomer resin, an acrylic resin, and a silicone resin, wherein the heat-conducting resin sheet has a thermal conductivity of 5 W/m·K or more and a 30% compressive strength B of 1500 kPa or less as measured at a compression rate of 1.0 mm/min, wherein compressive strength B/compressive strength A is 2 or less or compressive strength C/compressive strength B is 2 or less, where compressive strength A is a 30% compressive strength as measured at a compression rate of 0.1 mm/min and compressive strength C is a 30% compressive strength as measured at a compression rate of 10.0 mm/min, wherein a volume of the thermally conductive plate-shaped particle is 15 to 50% by volume in the heat-conducting resin sheet, and wherein a volume ratio of the thermally conductive plate-shaped particle to the thermally conductive spherical particle (volume of thermally conductive plate-shaped particle/volume of thermally conductive spherical particle) is 30/70 to 90/10.

3. The heat-conducting resin sheet according to claim 1, wherein the thermally conductive plate-shaped particle has an average particle size of 1 to 400 μm, and the thermally conductive spherical particle has an average particle size of 1 to 100 μm.

4. The heat-conducting resin sheet according to claim 1, wherein the heat-conducting resin sheet has a heat resistance of 5 K/W or less under 10% compression.

5. The heat-conducting resin sheet according to claim 1, wherein an average of the aspect ratios of the thermally conductive particles included in the heat-conducting resin sheet is 5 or more.

6. The heat-conducting resin sheet according to claim 1, wherein a major axis of the thermally conductive plate-shaped particle is oriented at an angle of 60° or more with respect to a surface of the sheet.

7. The heat-conducting resin sheet according to claim 1, wherein the resin is the elastomer resin.

8. The heat-conducting resin sheet according to claim 7, wherein the elastomer resin comprises a liquid elastomer resin.

9. The heat-conducting resin sheet according to claim 1, wherein the heat-conducting resin sheet is crosslinked.

* * * * *